(12) United States Patent
    Tran et al.

(10) Patent No.: US 11,094,585 B2
(45) Date of Patent: Aug. 17, 2021

(54) METHODS OF FORMING A CONDUCTIVE CONTACT STRUCTURE TO A TOP ELECTRODE OF AN EMBEDDED MEMORY DEVICE ON AN IC PRODUCT AND A CORRESPONDING IC PRODUCT

(71) Applicant: GLOBALFOUNDRIES U.S. Inc., Santa Clara, CA (US)

(72) Inventors: Xuan Anh Tran, Clifton Park, NY (US); Eswar Ramanathan, Mechanicvile, NY (US); Sunil Kumar Singh, Mechanicville, NY (US); Suryanarayana Kalaga, Austin, TX (US); Suresh Kumar Regonda, Clifton Park, NY (US); Juan Boon Tan, Singapore (SG)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 21 days.

(21) Appl. No.: 16/504,737

(22) Filed: Jul. 8, 2019

(65) Prior Publication Data
    US 2021/0013095 A1    Jan. 14, 2021

(51) Int. Cl.
    *H01L 21/768*    (2006.01)
    *H01L 23/535*    (2006.01)
    (Continued)

(52) U.S. Cl.
    CPC .. *H01L 21/76831* (2013.01); *H01L 21/76802* (2013.01); *H01L 21/76877* (2013.01);
    (Continued)

(58) Field of Classification Search
    CPC ......... H01L 21/76831; H01L 21/76802; H01L 21/76877; H01L 23/535; H01L 27/11502;
    (Continued)

(56) References Cited

U.S. PATENT DOCUMENTS 6,927,159 B2 *  8/2005  Faust ................ H01L 21/31116
                                                257/E21.226
7,560,337 B2    7/2009  Ho et al.
                        (Continued)

OTHER PUBLICATIONS

Farrell et al., "Mult-color fly-cut-SAQP for reduced process variation," Proc. of SPIE, vol. 10586, Apr. 9, 2018.
(Continued)

*Primary Examiner* — Fernando L Toledo
*Assistant Examiner* — Neil R Prasad
(74) *Attorney, Agent, or Firm* — Hoffman Warnick LLC

(57) ABSTRACT

One illustrative method disclosed herein includes, among other things, selectively forming a sacrificial material on an upper surface of a top electrode of a memory cell, forming at least one layer of insulating material around the sacrificial material and removing the sacrificial material so as to form an opening in the at least one layer of insulating material, wherein the opening exposes the upper surface of the top electrode. The method also includes forming an internal sidewall spacer within the opening in the at least one layer of insulating material and forming a conductive contact structure that is conductively coupled to the upper surface of the top electrode, wherein a portion of the conductive contact structure is surrounded by the internal sidewall spacer.

13 Claims, 13 Drawing Sheets

(51) Int. Cl.
  *H01L 43/02* (2006.01)
  *H01L 45/00* (2006.01)
  *H01L 27/22* (2006.01)
  *H01L 27/11502* (2017.01)
  *H01L 43/12* (2006.01)

(52) U.S. Cl.
  CPC ...... *H01L 23/535* (2013.01); *H01L 27/11502* (2013.01); *H01L 27/222* (2013.01); *H01L 43/02* (2013.01); *H01L 43/12* (2013.01); *H01L 45/06* (2013.01); *H01L 45/08* (2013.01); *H01L 45/16* (2013.01)

(58) Field of Classification Search
  CPC ....... H01L 27/222; H01L 43/02; H01L 43/12; H01L 45/06; H01L 45/08; H01L 45/16
  See application file for complete search history.

(56) References Cited

U.S. PATENT DOCUMENTS

| | | |
|---|---|---|
| 8,143,612 B2 | 3/2012 | Lung et al. |
| 8,963,114 B2 | 2/2015 | Liao et al. |
| 2003/0139034 A1* | 7/2003 | Yuang ............... H01L 21/76831 438/634 |
| 2003/0203510 A1* | 10/2003 | Hineman ................ G11C 11/15 438/3 |
| 2009/0090899 A1* | 4/2009 | Lim ...................... H01L 45/144 257/4 |
| 2010/0065808 A1* | 3/2010 | Lung .................. H01L 45/1641 257/5 |
| 2016/0163593 A1* | 6/2016 | Tsukamoto ....... H01L 27/10888 438/382 |
| 2017/0053863 A1* | 2/2017 | Lu ..................... H01L 21/76879 |

OTHER PUBLICATIONS

Hsieh et al., "Ultra High Density 3D Via RRAM in Pure 28nm CMOS Process," IEDM13-260-63, 2013 IEEE.

Oh et al., "Full Integration of Highly Manufacturable 512Mb PRAM based on 90nm Technology".

Yang et al., "Characterization of Copper Electromigration Dependence on Selective Chemical Vapor Deposited Cobalt Capping Layer Thickness," IEEE Electron Device Letters, 32:560-62, Apr. 2011.

* cited by examiner

METHODS OF FORMING A CONDUCTIVE CONTACT STRUCTURE TO A TOP ELECTRODE OF AN EMBEDDED MEMORY DEVICE ON AN IC PRODUCT AND A CORRESPONDING IC PRODUCT

BACKGROUND OF THE INVENTION

Field of the Invention

The present disclosure generally relates to the fabrication of integrated circuits, and, more particularly, to various novel methods of forming a conductive contact structure to a top electrode of an embedded memory device on an integrated circuit (IC) product and a corresponding IC product.

Description of the Related Art

In many modern integrated circuit products, embedded memory devices and logic circuits (e.g., microprocessors) are formed on the same substrate or chip. Such embedded memory devices may come in a variety of forms, e.g., an MTJ (magnetic tunnel junction) memory device, an RRAM (resistive random access memory) device, a PRAM (phase-change random access memory) device, an MRAM (magnetic random access memory) device, a FRAM (ferroelectric random access memory) device, etc. Typically, all of the embedded memory devices have a top electrode to which a conductive contact structure must be formed for the device to be operational.

Various techniques have been employed to try to form such a conductive contact structure to the top electrode of such a memory device. Typically, after the top electrode is formed, it is covered by a layer of insulating material. At some point later in the process flow, the upper surface of the top electrode must be exposed to allow for formation of the conductive contact structure. One technique involves etching a trench into the layer of insulating material so as to expose or "reveal" the top electrode. This necessitates that the bottom of the trench extend past the upper surface of the top electrode. One problem with this technique is that it typically requires that the top electrode be made relatively thicker so as to provide an increased process window and reduce the chances of the trench exposing other parts of the memory device, leading to the creation of an undesirable electrical short that would render the memory device inoperable. Another manufacturing technique that is commonly employed involves directly patterning (via masking and etching) a via that is positioned and aligned so as to expose the upper surface of the top electrode. One problem with this approach is the fact that, as device dimensions continue to shrink, it is very difficult to properly align the via such that it only exposes a portion of the upper surface of the top electrode. Any misalignment of the via relative to the top electrode can result in undesirable exposure of the sidewalls of the top electrode, which can also lead to undesirable electrical shorts and device inoperability. Additionally, these processing steps lead to higher manufacturing costs and require the use of additional masking layers.

The present disclosure is generally directed to various novel methods of forming a conductive contact structure to a top electrode of an embedded memory device on an integrated circuit (IC) product and a corresponding IC product that may at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a conductive contact structure to a top electrode of an embedded memory device on an IC product and an IC product having such a novel corresponding configuration. One illustrative method disclosed herein includes, among other things, performing a selective formation process to selectively form a sacrificial material on an upper surface of the top electrode, forming at least one layer of insulating material around the sacrificial material and removing the sacrificial material so as to form an opening in the at least one layer of insulating material, wherein the opening exposes the upper surface of the top electrode. In this illustrative example, the method also includes forming an internal sidewall spacer within the opening in the at least one layer of insulating material and forming a conductive contact structure that is conductively coupled to the upper surface of the top electrode, wherein a portion of the conductive contact structure is surrounded by the internal sidewall spacer.

One illustrative integrated circuit product disclosed herein includes a memory cell including a top electrode, an opening in at least one layer of insulating material, wherein the opening exposes at least a portion of an upper surface of the top electrode of the memory cell, and an internal sidewall spacer positioned within the opening, wherein the insulating material and the internal sidewall spacer are made of different materials. The product also includes a conductive contact structure that is conductively coupled to the upper surface of the top electrode, wherein a portion of the conductive contact structure is surrounded by the internal sidewall spacer.

BRIEF DESCRIPTION OF THE DRAWINGS

The disclosure may be understood by reference to the following description taken in conjunction with the accompanying drawings, in which like reference numerals identify like elements, and in which.

Figure 1:
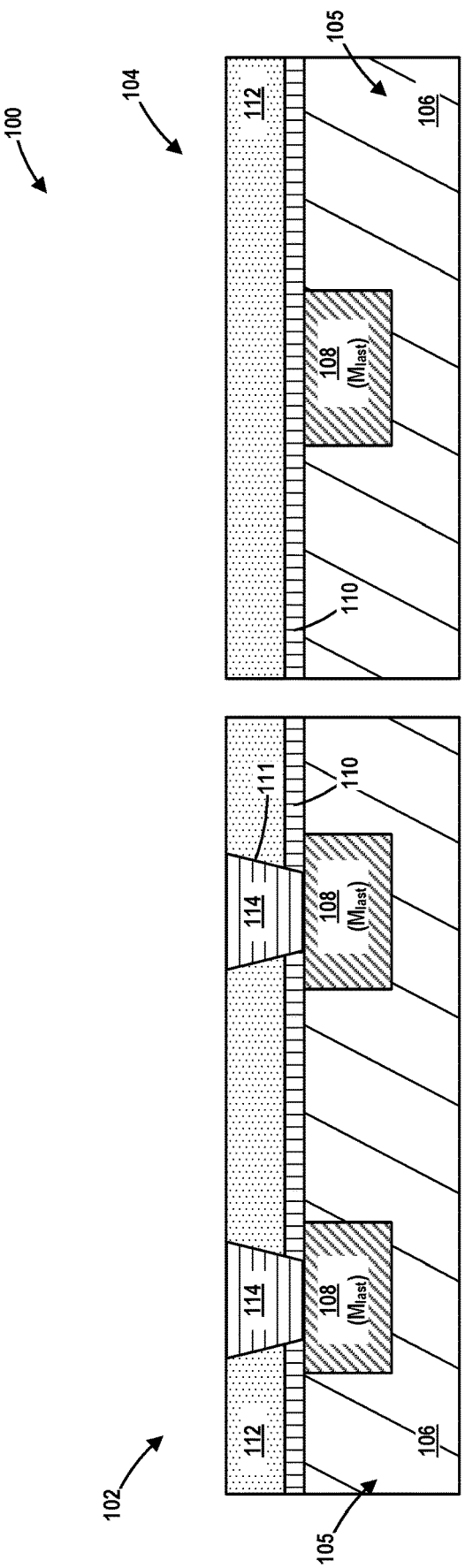
FIGS. 1-13 depict various novel methods of forming a conductive contact structure to a top electrode of an embedded memory device on an IC product and an IC product having such a novel corresponding configuration.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification.

It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-13 depict various novel methods of forming a conductive contact structure to a top electrode of an embedded memory device on an IC product 100 and an IC product 100 having such a novel corresponding configuration. The IC product 100 will be formed on and above a semiconductor substrate (not shown). The semiconductor substrate may have a variety of configurations, such as a bulk silicon configuration. The substrate may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate may be made of silicon or it may be made of materials other than silicon. Thus, the terms "substrate" or "semiconductor substrate" should be understood to cover all semiconducting materials and all forms of such materials. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application.

In general, and with reference to FIG. 1, the IC product 100 comprises a memory region 102 where one or more memory devices will be formed and a logic region 104 where one or more logic circuits (e.g., microprocessor circuits) will be formed in and above a semiconductor substrate (not shown in the attached figures). As is typical, the IC product 100 includes a plurality of metallization layers that constitute the overall wiring pattern for the IC product 100. These metallization layers may be formed on the IC product 100 by performing traditional manufacturing processes. These metallization layers are typically comprised of layers of insulating material (e.g., silicon dioxide) with a plurality of conductive metal lines and/or or conductive vias formed in the layers of material. The conductive metal lines are routed across the substrate in various patterns and arrangements and provide the means for intra-layer electrical communication between the devices and structures formed on or above the substrate. The conductive vias provide the means for allowing electrical communication between the conductive metal lines in adjacent metallization layers. The first metallization layer of an IC product is typically referred to as the "M1" layer (or in some cases the "M0" layer), while the conductive vias that are used to establish electrical connection between the M1 layer and the conductive lines in the immediately adjacent upper metallization layer (the "M2 layer") are typically referred to as "V1" vias. So-called device level contacts (not shown) are formed above the substrate so as to provide electrical communication between the various devices, e.g., transistors, resistors, etc., that are formed on or immediately adjacent the semiconductor substrate.

FIG. 1 depicts the IC product 100 after several process operations have been formed. More specifically, FIG. 1 depicts the product 100 at a point in time wherein an illustrative (and representative) metallization layer 105 has been formed above a semiconductor substrate (not shown). As will be appreciated by those skilled in the art after a complete reading of the present application, the metallization layer 105 is intended to be representative of any metallization layer that may be formed on the IC product irrespective of its location relative to an upper surface of the semiconductor substrate or any of the other metallization layers formed on the IC product 100.

With continued reference to FIG. 1, the product 100 is depicted at a point in time where a layer of insulating material 106, e.g., silicon dioxide, for a representative metallization layer—$M_{last}$—of the IC product 100 has been formed above the semiconductor substrate. As noted above the $M_{last}$ metallization layer is intended to be representative of any metallization layer formed at any level on the IC product 100. In the example shown in FIG. 1, various illustrative conductive metal lines 108 have been formed in the layer of insulating material 106 in both the memory region 102 and the logic region 104. The number, size, shape, configuration and overall routing of the metal lines 108 may vary depending upon the particular application. In one example, the conductive metal lines 108 are elongated features that extend across the product 100 in a direction that is transverse to the plane of the drawing in FIG. 1. The metal lines 108 may be comprised of any of a variety of different conductive materials, e.g., copper, aluminum, tungsten, etc., and they may be formed by traditional manufacturing techniques, e.g., by performing a damascene process for cases where the conductive lines 108 are made of copper and perhaps by performing traditional deposition and etching processes when the conductive lines 108 are made of a conductive material that may readily be patterned using traditional masking and patterning (e.g., etching) techniques.

Also depicted in FIG. 1 is an etch-stop layer 110 that was formed above the layer of insulating material 106. The etch-stop layer 110 may be comprised of a variety of different materials, e.g., silicon nitride, carbon-doped nitride (NDC), NBLK, advanced etch stop layers like AlN/ODC, etc. The thickness of the etch-stop layer 110 may vary depending upon the particular application. Next, a layer of insulating material 112 was blanket-deposited above the etch-stop layer 110. If desired, a planarization process may be performed on the layer of insulating material 112 to substantially planarize its upper surface. The layer of insulating material 112 may be comprised of a variety of different insulating materials, e.g., silicon dioxide, TEOS, ultra low-k materials, OMCTS, densified ULK, etc., and its vertical thickness may vary depending upon the particular application.

Next, a first patterned etch mask (not shown) was formed on the product 100. This particular patterned etch mask covers the logic region 104 but exposes portions of the layer of insulating material 112 at locations in the memory region 102 where it is desired to establish electrical contact with the conductive lines 108 formed in the layer of insulating material 106 within the memory region 102. At that point, a first etching process may be performed through the first patterned etch mask (not shown) so as to remove exposed portions of the layer of insulating material 112 in the memory region 102. This etching process operation stops on the etch stop layer 110. Thereafter, a relatively brief etching process may be performed to etch through the etch stop layer 110 so as to thereby form overall contact openings 111 that extend through the layer of insulating material 112 and the etch-stop layer 110 and thereby expose at least portion of the upper surface of the conductive lines 108 in the memory region 102. At that point, the first patterned etch mask may be removed. Then, a conductive via 114 is formed in the openings 111 using traditional manufacturing processing techniques, e.g., by performing a deposition process so as to overfill the openings 111 in the memory region 102 with conductive material(s), followed by performing a chemical mechanical planarization (CMP) process operation to remove the excess amounts of the conductive material for the conductive vias 114 that are positioned on or above the upper surface of the layer of insulating material 112. In one illustrative embodiment, when viewed from above, the conductive vias 114 may have a substantially circular configuration. In other situations, the conductive vias 114 may have a substantially oval configuration. The vertical thickness of the illustrative vias 114 may vary depending upon the particular application, and they may be comprised of a variety of conductive materials, e.g., copper, tungsten, aluminum, etc. The conductive vias 114 may be comprised of the same material of construction as that of the conductive metal line 108 to which it is conductively coupled, but that may not be the case in all applications. Of course, as will be appreciated by those skilled in the art after a complete reading of the present application, various barrier layers or liner layers (neither of which is shown) may be formed as part of the process of forming the illustrative conductive lines 108 and the conductive vias 114. Moreover, various additional conductive structures that will be formed on the IC product 100, as discussed more fully below, may or may not include such illustrative barrier layers and/or liner layers, which are not depicted so as to not overly complicate the attached drawings.

Figure 2:
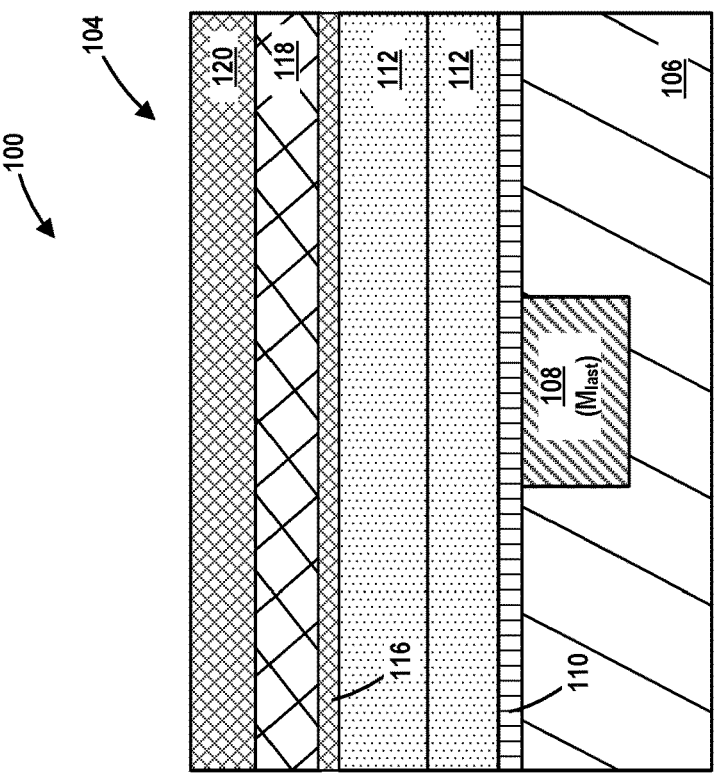
Figure 2:
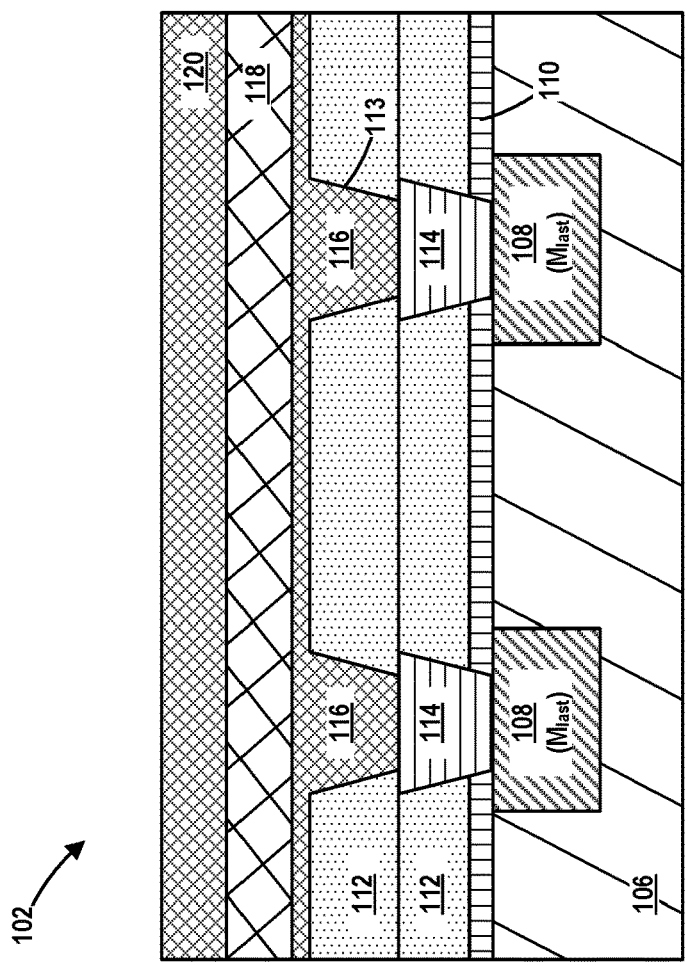

FIG. 2 depicts the IC product 100 after several process operations were performed. First, a second layer of insulating material 112 was formed on the product 100. For ease of reference, the reference numeral 112 will be used to refer to all of the various layers of insulating material that will be formed on the product 100. Of course all of the layers of insulating material need not be of the same material, e.g., silicon dioxide, but that may be the case in some applications. Thereafter, a second patterned etch mask (not shown) was formed on the product 100 above the second layer of insulating material 112. The second patterned etch mask covers the logic region 104 and exposes portions of the memory region 102 wherein it is desired to form conductive structures that will conductively contact the vias 114. At that point, an etching process may be performed through the second patterned etch mask (not shown) so as to form openings 113 in the second layer of insulating material 112 in the memory region 102. The formation of the openings 113 exposes the upper surface of the conductive vias 114. Then, the second patterned etch mask was removed. Next, a layer of conductive material 116 was formed in both the memory region 102 and the logic region 104. As depicted, the conductive material 116 overfills the openings 113 in the second layer of insulating material 112 in the memory region 102. In the depicted example, a CMP process may be performed to remove some of the conductive material 116 positioned above the memory region 102 and the logic region 104, while leaving a relatively thin layer of the conductive material 116 positioned above the second layer of insulating material 112 in both the memory region 102 and the contact region 104. In other applications, a CMP process may be performed to remove all of the conductive layer 116 positioned above the upper surface of the layer of insulating material 112 in both the memory region 102 and the logic region 104, thereby leaving the conductive material 116 only in the openings 113 in the second layer of insulating material 112 in the memory region 102. In yet other applications, after removing the conductive material everywhere outside of the openings 113, additional conductive material 116 may be deposited on the product followed by performing a CMP process. In one illustrative embodiment, when viewed from above, the portion of the conductive material 116 within the opening 113 may have a substantially circular configuration. In other situations, the conductive material 116 within the opening 113 may have a substantially oval configuration. The layer of conductive material 116 may be formed to any desired thickness and it may comprise any conductive material, e.g., copper, tungsten, ruthenium, aluminum, TaN, etc.

Figure 3:
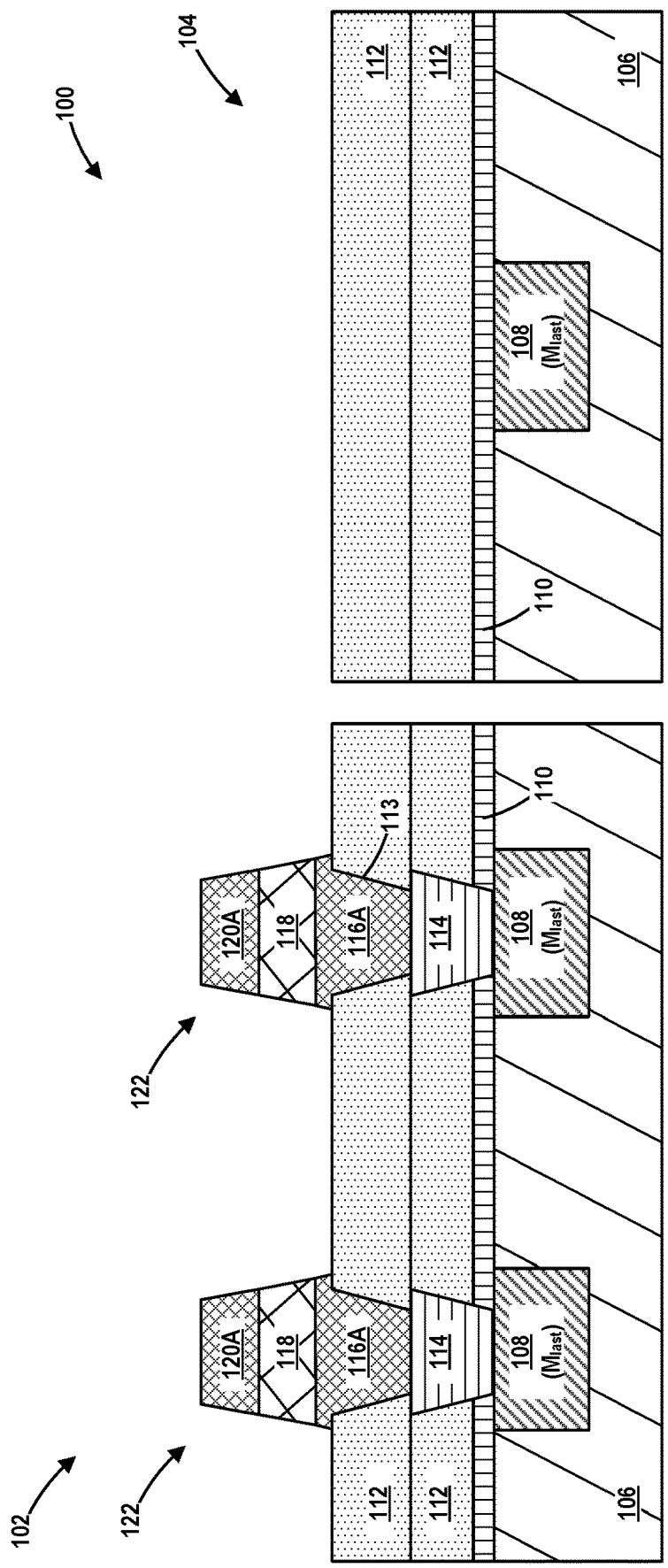

Next, with reference to FIGS. 2 and 3, one or more layers of memory state material 118 was formed above the product 100 in both the memory region 102 and the logic region 104. As will be appreciated by those skilled in the art after a complete reading of the present application, the present disclosure is directed to the formation of a conductive contact to a top electrode of an embedded memory cell 122 (see FIG. 3) on the IC product etch stop layer 110. The memory cell 122 depicted herein is intended to be generic and representative in nature. By way of example only, and not by way of limitation, the generic memory cells 122 depicted herein may take a variety of forms, have a variety of different configurations and may comprise different materials. For example, the memory cells 122 depicted herein may be an MTJ (magnetic tunnel junction) memory device, an RRAM (resistive random access memory) device, a PRAM (phase-change random access memory) device, an MRAM (magnetic random access memory) device, a FRAM (ferroelectric random access memory) device, etc. Such a memory cell 122 includes some form of memory state material 118 that is typically positioned between a bottom electrode and a top electrode. In some applications, some characteristic of the memory state material 118, e.g., resistivity, may be altered by the application of an electrical charge to the memory device 122, and these altered states may be representative of a logical "1" or a logical "0" in a digital circuit. In some situations, the memory state material 118 may actually store an electrical charge. In any event, sensing circuitry on the IC product 100 may be used to sense the state of the memory state material 118, to determine whether or not a particular memory cell 122 represents a logical "1" or a logical "0" and use that information within the various circuits on the IC product 100. The particular materials used for the memory state material 118 may vary depending upon the particular type of memory device that is fabricated. Moreover, the single layer of memory state material 118 depicted in the drawings is intended to be representative in that, in a real-world device, the memory state material 118 may comprise a plurality of layers of material. Thus, the reference to any "memory state material" in the specification and in the attached claims should be understood to cover any form of any material(s) that may be employed on any form of a memory device that can be manipulated or changed so as to reflect two opposite logical states of the memory device.

Still with reference to FIG. 2, after formation of the memory state material 118, another layer of conductive material 120 was formed on the product 100 in both the memory region 102 and the logic region 104. The layer of conductive material 120 may be formed to any desired thickness and it may comprise any conductive material, such as those listed above for the layer of conductive material 116. In some applications, the layer of conductive material 116 and the layer of conductive material 120 may be made of the same material, but that may not be the case in all applications.

FIG. 3 depicts the product 100 after several process operations were performed. First, a patterned etch mask (not shown) was formed above the product 100. The patterned etch mask exposes the logic region 104 while covering portions of the memory region 102. Thereafter, one or more etching processes were performed to remove the exposed portions of the layer of conductive material 120, the memory state material 118 and the layer of conductive material 116. Thereafter, the patterned etch mask was removed. As depicted, this process results in the formation of two illustrative memory cells 122 in the memory section 102. Each of the memory cells 122 comprises a top electrode 120A, a bottom electrode 116A and a portion of the memory state material 118 positioned between those two electrodes.

Figure 4:
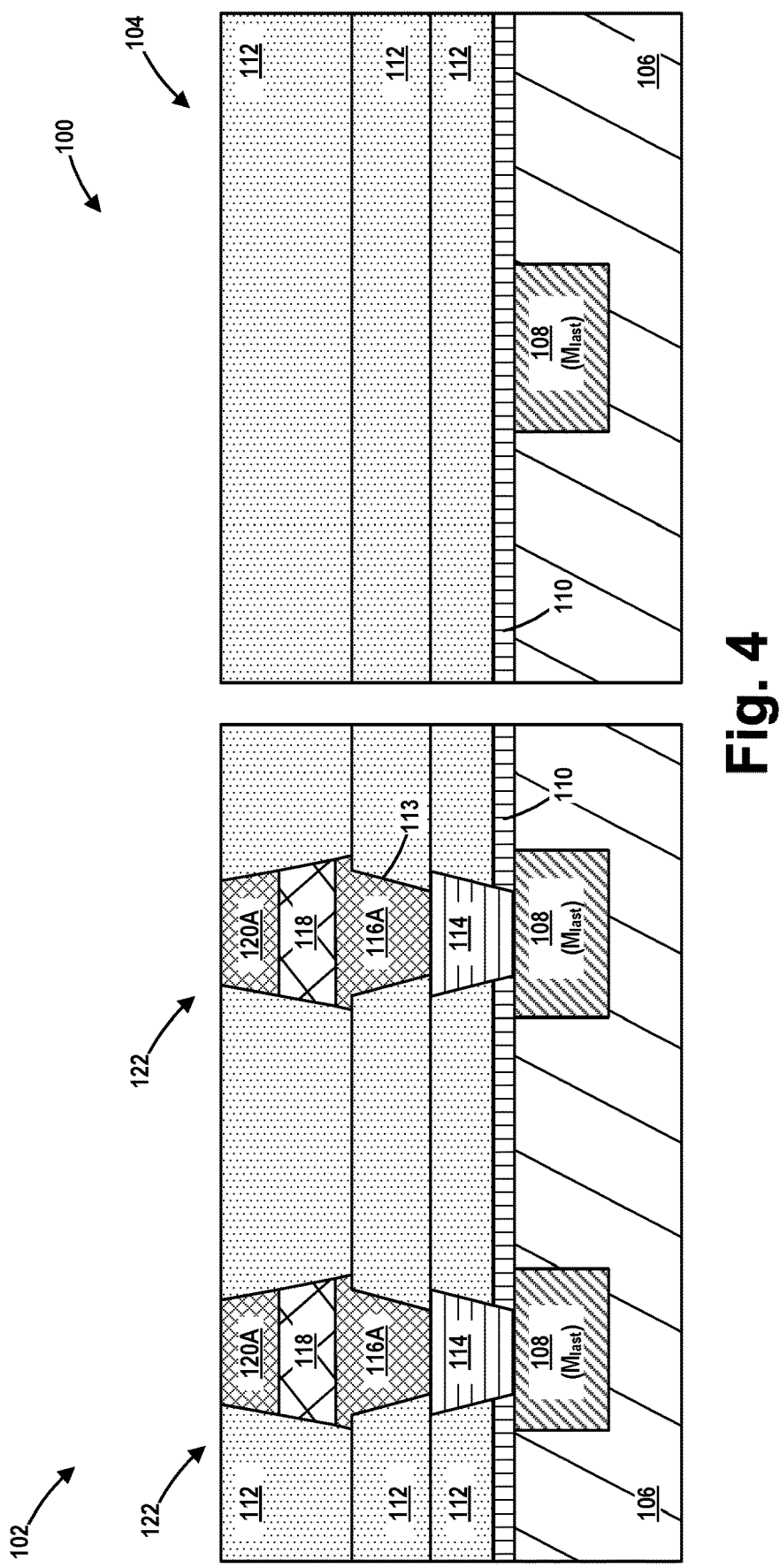

FIG. 4 depicts the product after a third layer of insulating material 112 was formed on the product 100 and after a planarization process (CMP or etch-back) was performed. As a result, the upper surface of the top electrode 120A of each of the memory cells 122 is exposed.

Figure 5:
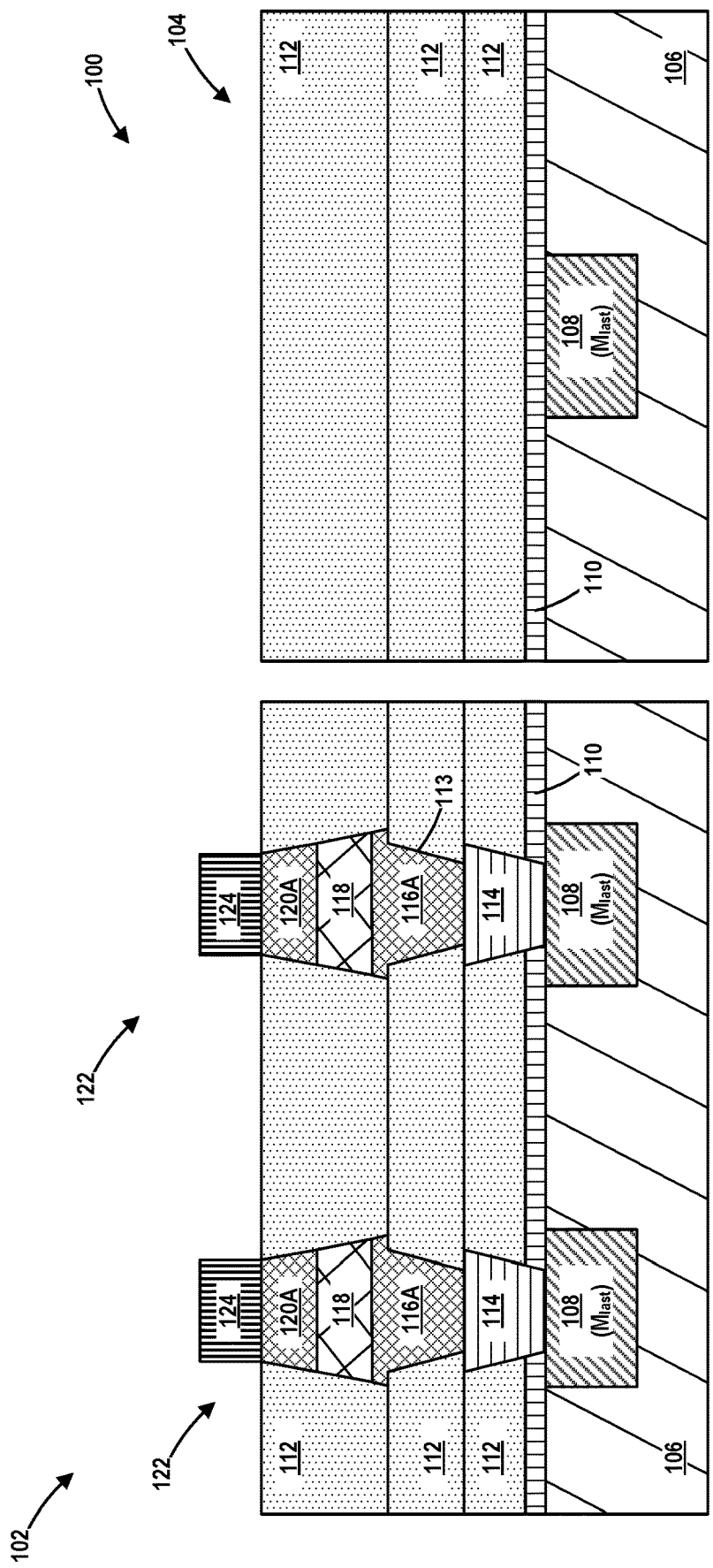

FIG. 5 depicts the product 100 after a selective deposition process was performed to form a sacrificial material 124 only on the exposed upper surface of each of the top electrodes 120A. In one illustrative embodiment, the sacrificial material 124 may be a self-assembled material (SAM) or it may be a selectively grown metal material such as cobalt, etc. The sacrificial material 124 may be formed to any desired thickness.

Figure 6:
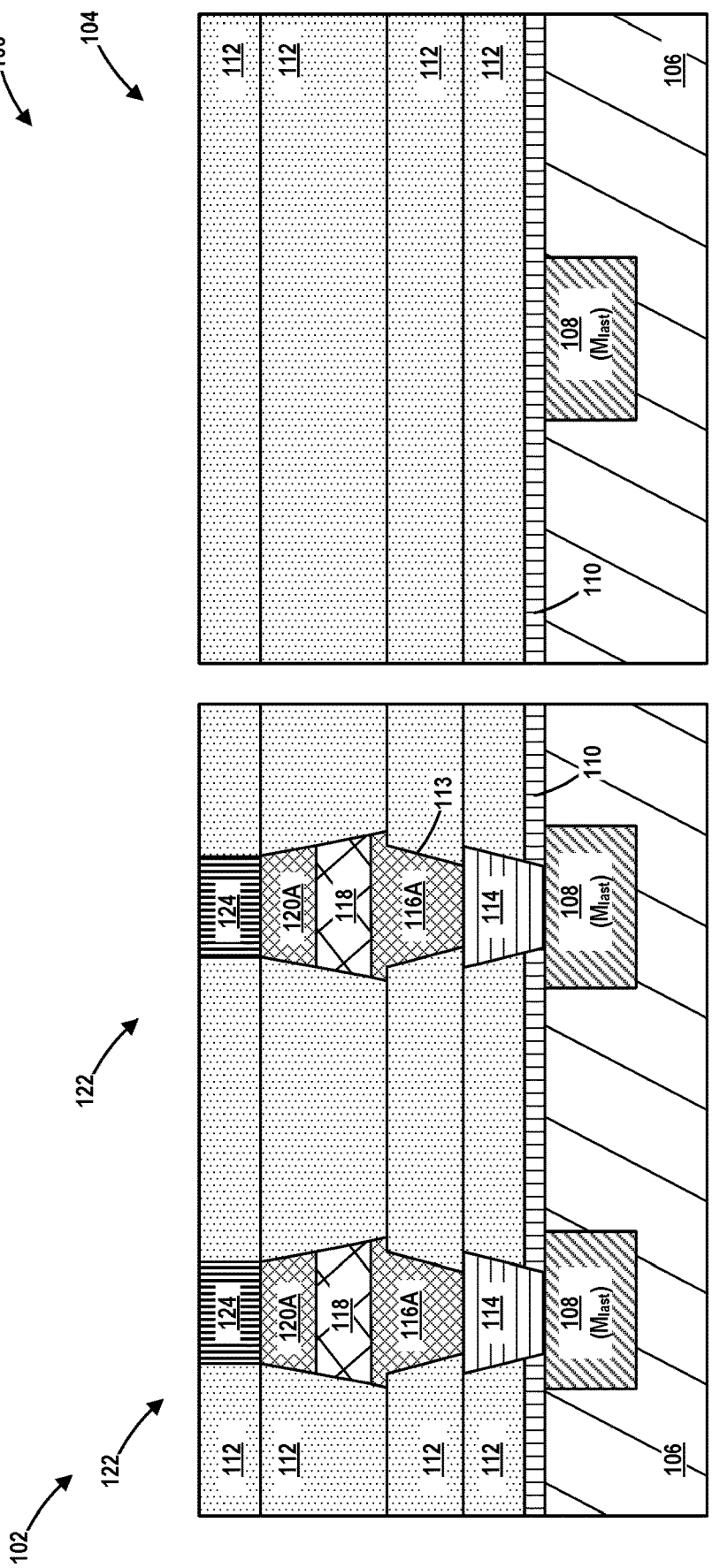

FIG. 6 depicts the product after a fourth layer of insulating material 112 was formed on the product 100 and after a planarization process (CMP or etch-back) was performed. As a result, the upper surface of the sacrificial material 124 above the top electrode 120A of each of the memory cells 122 is exposed.

Figure 7:
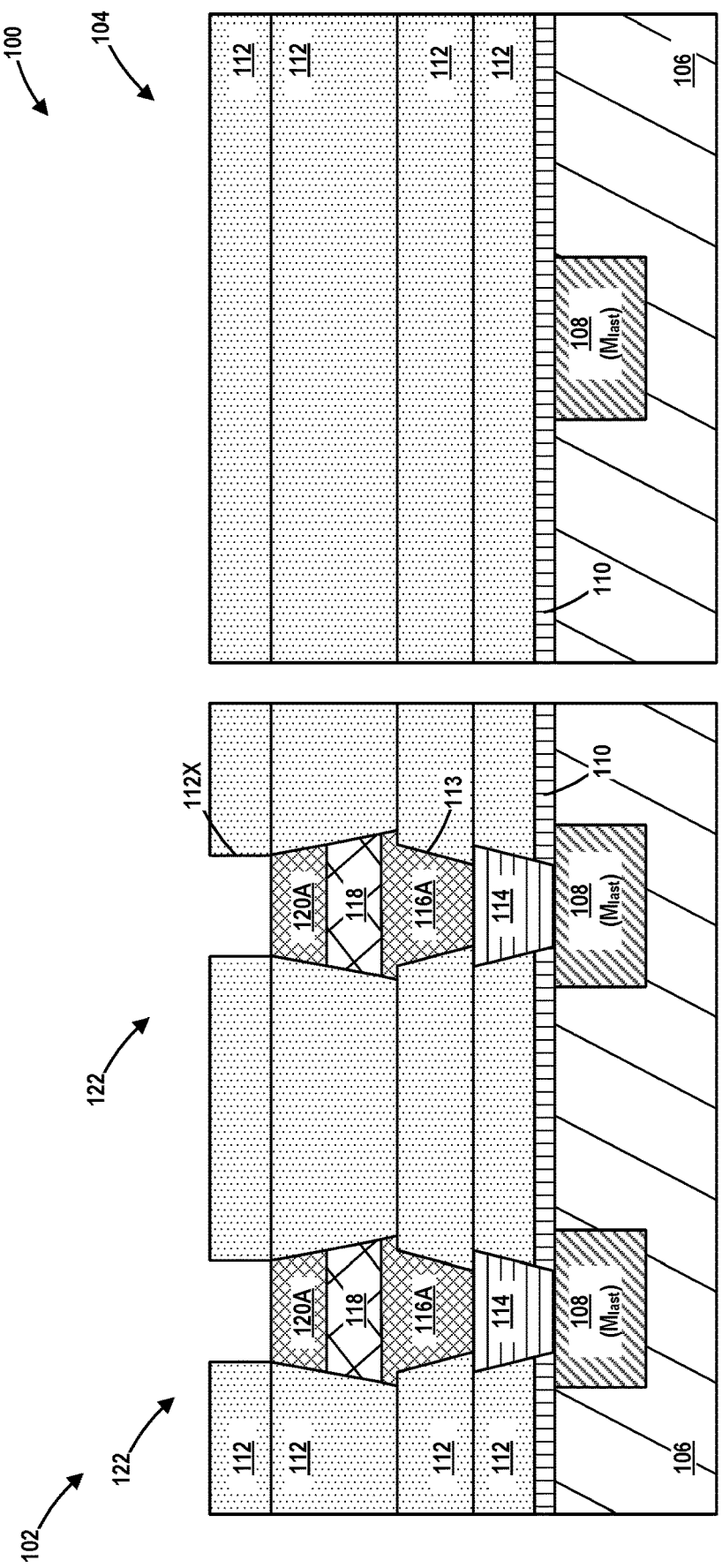

FIG. 7 depicts the product 100 after an etching process was performed to selectively remove the sacrificial material 124 relative to the surrounding materials. This results in the formation of openings 112X in the fourth layer of insulating material 112 and exposes the upper surface of each of the top electrodes 120A.

Figure 8:
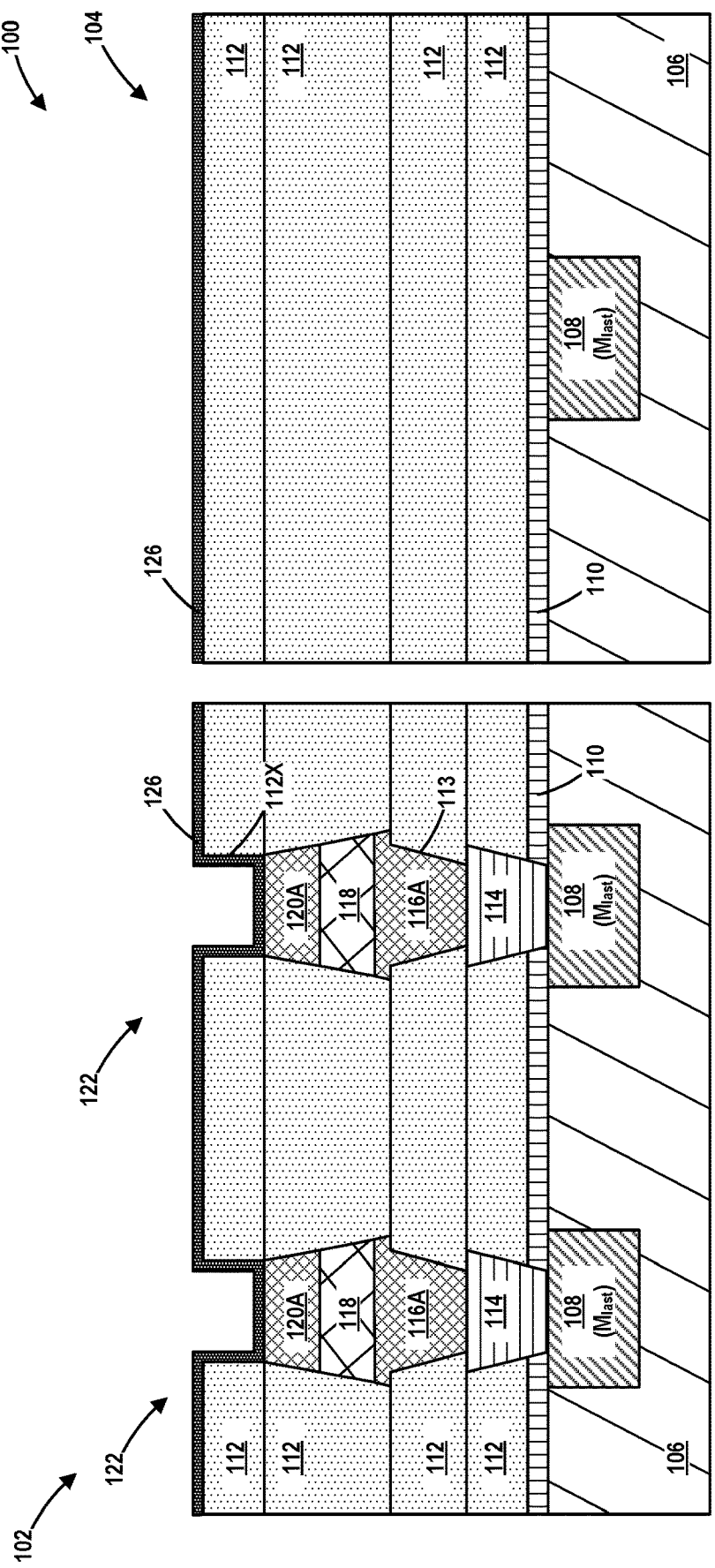

FIG. 8 depicts the IC product 100 after a conformal deposition process was performed to form a conformal layer of spacer material 126 across the product 100. The layer of spacer material 126 may be of any desired thickness and it may be comprised of any material that provides significant etch selectivity relative to the material of the fourth layer of insulating material 112 and the top electrode 120A. For example, in one illustrative embodiment, where the fourth layer of insulating material 112 is silicon dioxide, the layer of spacer material 126 may be made of silicon nitride. Of course, the layer of spacer material 126 may be made of a variety of different materials depending upon the particular application and the material of the fourth layer of insulating material 112, e.g., silicon dioxide, a low-k material, silicon nitride, SiCN, SiN, SiCO, and SiOCN, etc.

Figure 9:
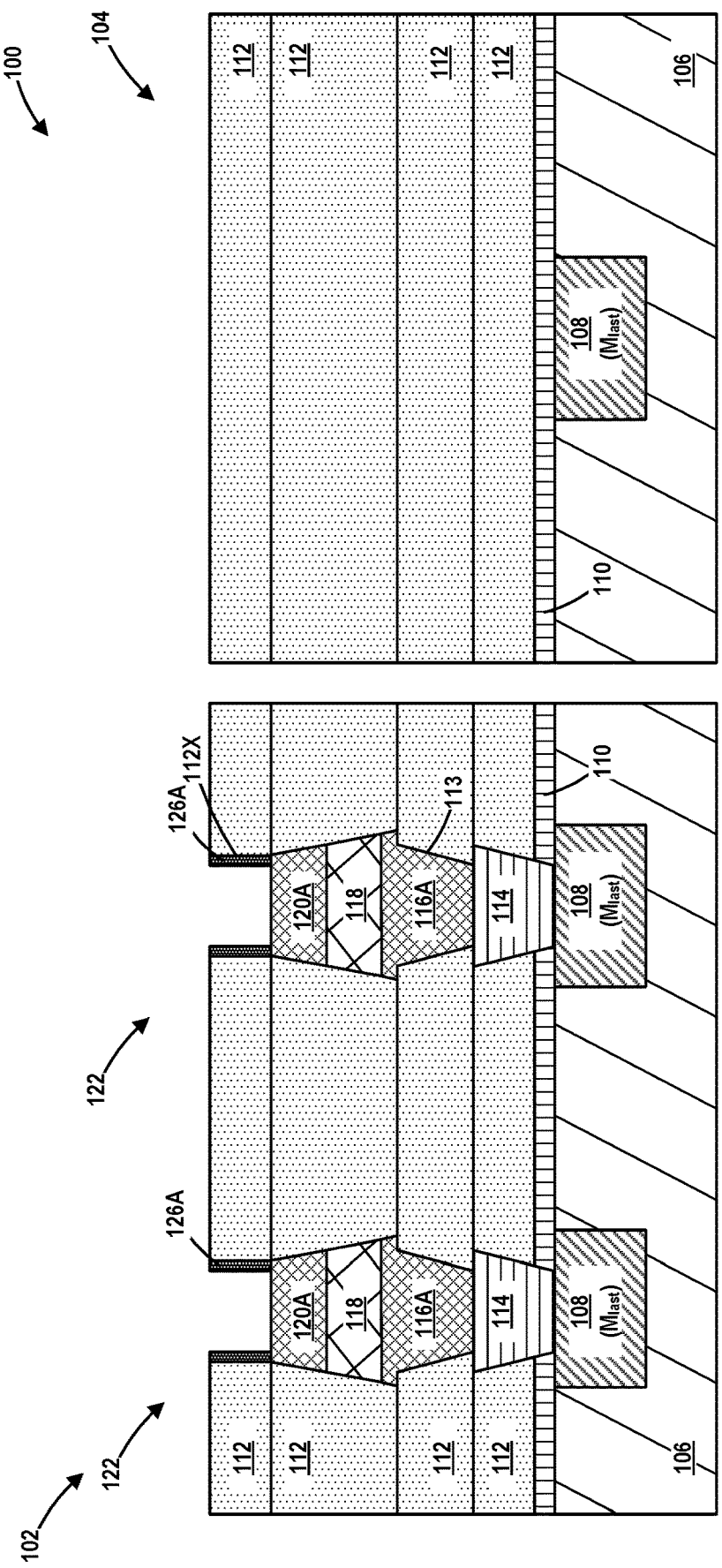

FIG. 9 depicts the product 100 after an anisotropic etching process was performed to remove horizontally positioned portions of the layer of spacer material 126. This etching process results in the formation of an internal sidewall spacer 126A in each of the openings 112X in the fourth layer of insulating material 112. The spacers 126A may be of any desired thickness (as measured at their base). This process operation also re-exposes the upper surface of the top electrode 120A that is not covered by the internal spacer 126A.

Figure 10:
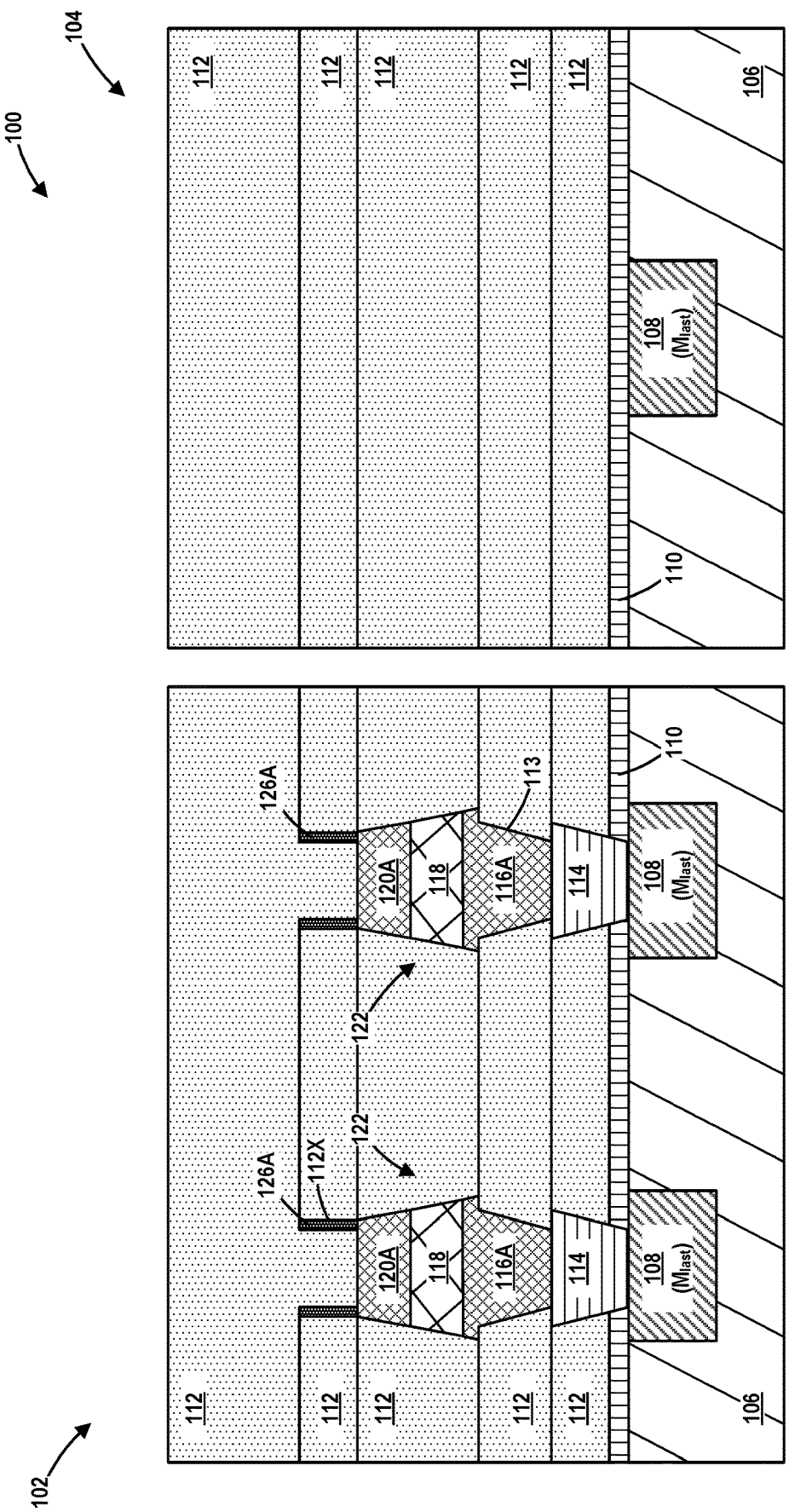
Figure 11:
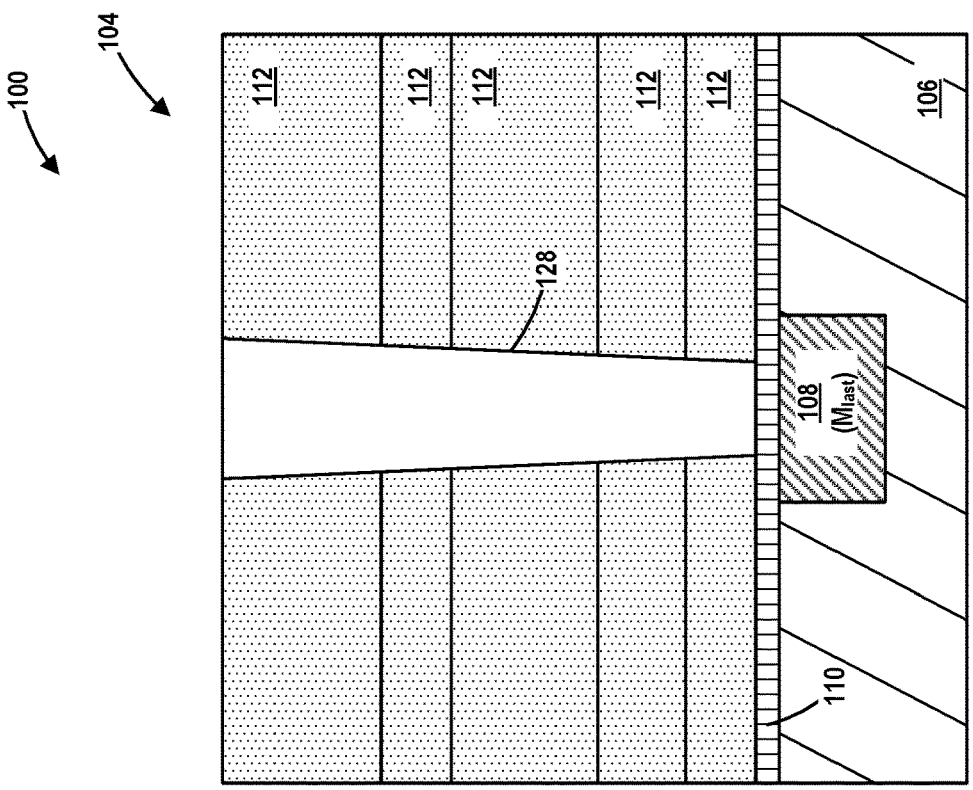
Figure 11:
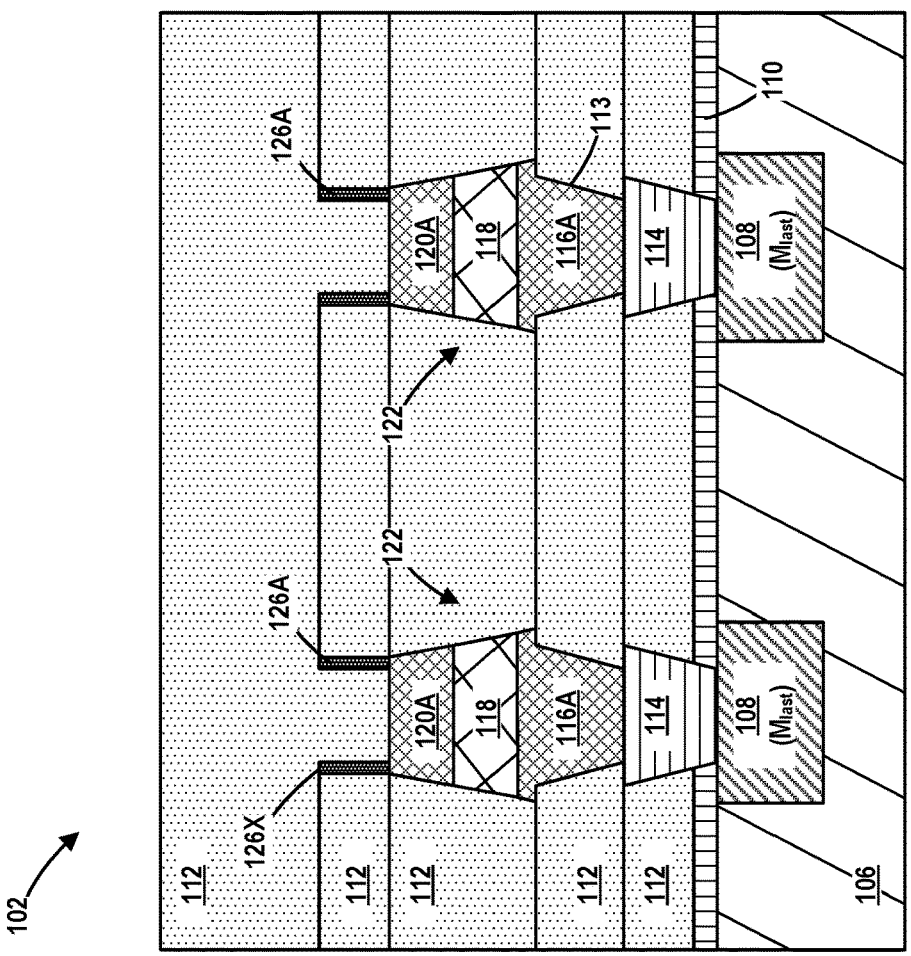
Figure 12:
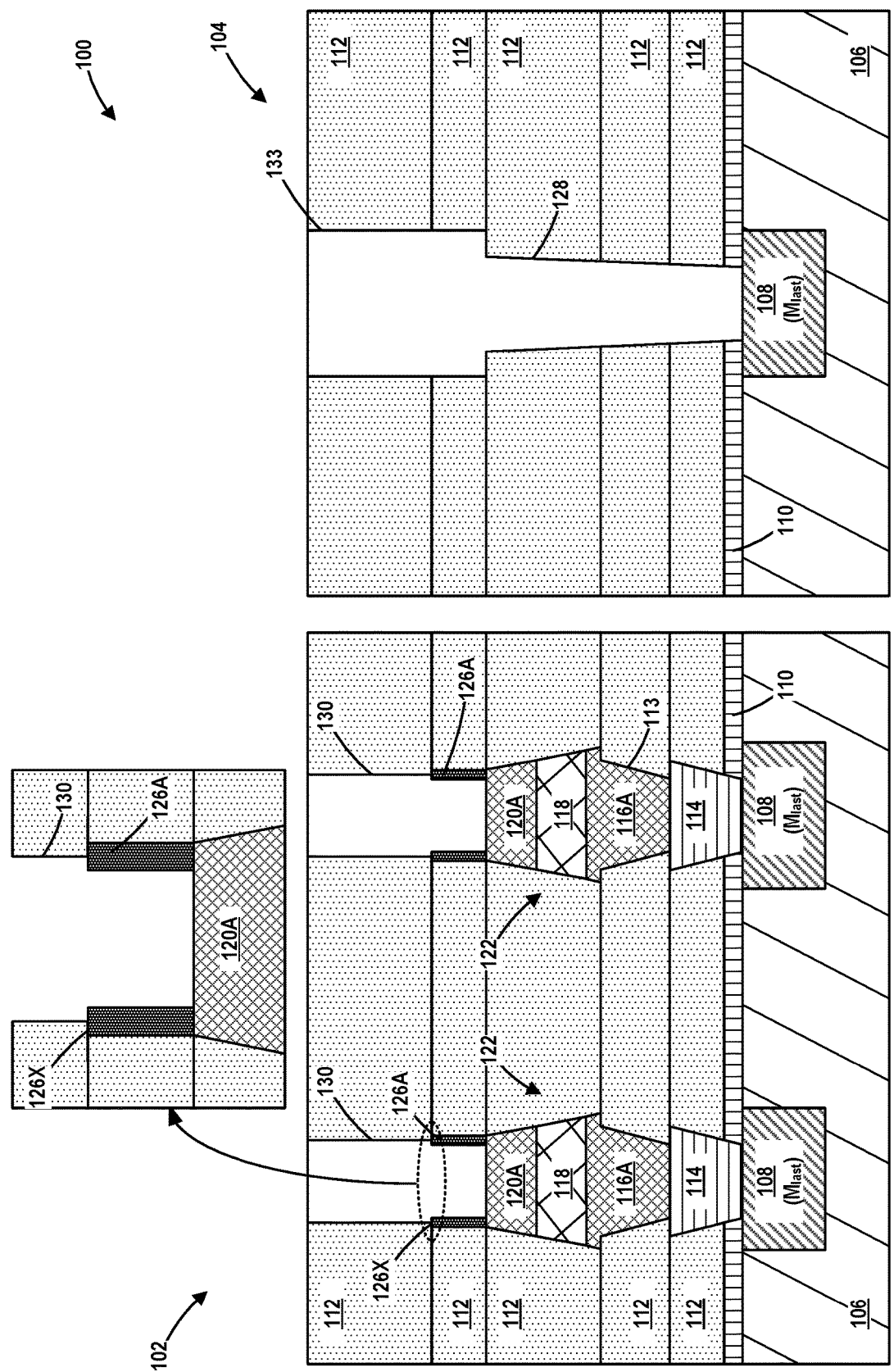
Figure 13:
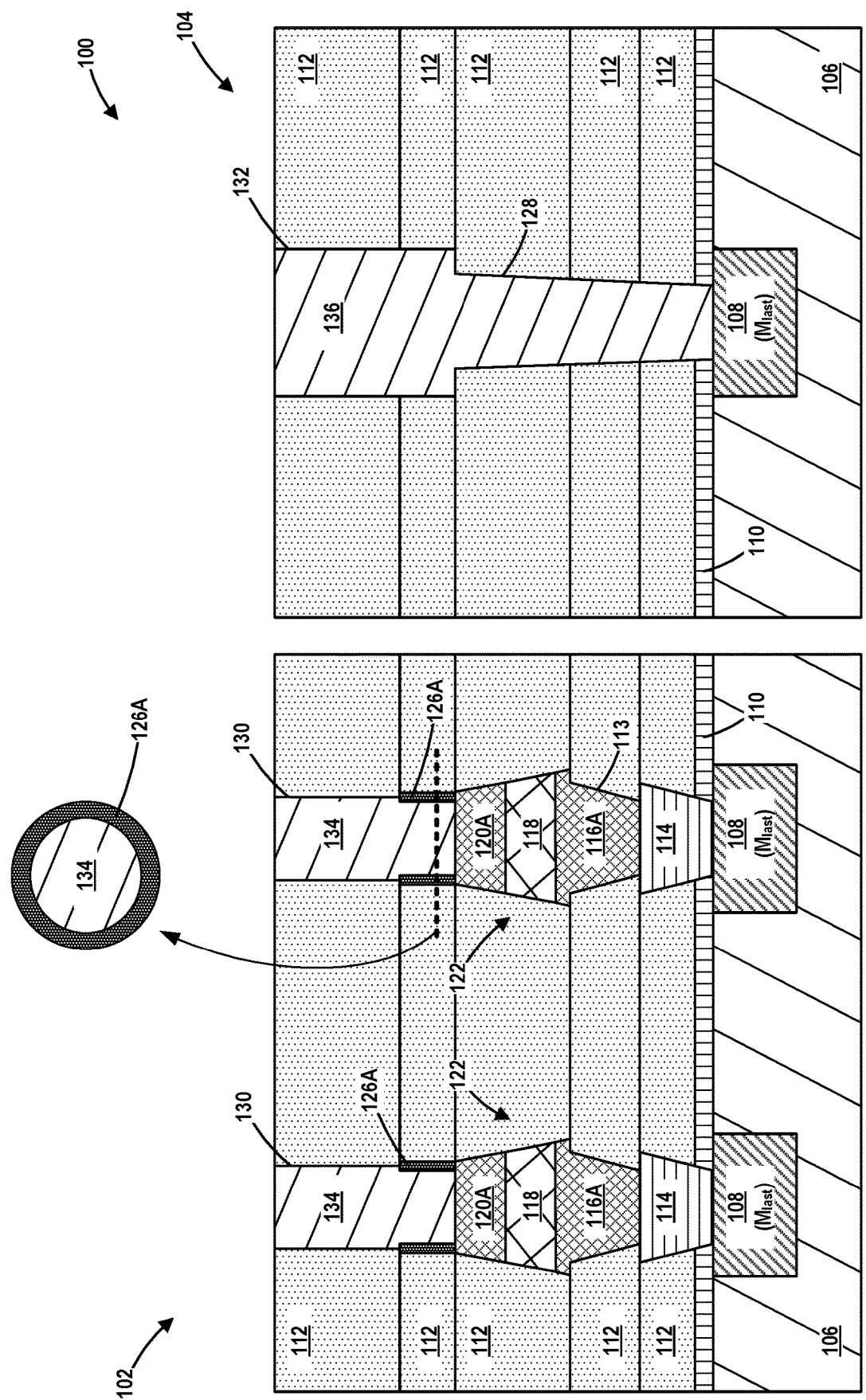

FIG. 10 depicts the product after a fifth layer of insulating material 112 was formed on the product 100 and after a planarization process (CMP or etch-back) was performed. The additional insulation material from the fifth layer of insulating material 112 overfills the portions of the opening 112X that are not filled by the internal sidewall spacer 126A. At the point of processing depicted in FIG. 10, various process operations may be performed to form various contact openings in the various layers of insulating material for various conductive contact structures that will conductively contact the top electrode 120A of each of the memory cells as well as a conductive contact structure that will conductively contact the metal line 108 in the logic regions. As will be appreciated by those skilled in the art after a complete reading of the present application, there are several possible process flows for forming such conductive contacts. FIGS. 11-13 depict one such illustrative process flow that employs a via first, trench last technique.

FIG. 11 depicts the process after a patterned etch mask (not shown) was formed above the product 100. The patterned etch mask covers the memory region 102 and exposes a portion of the logic region 104. Thereafter, at least one etching process was performed to form a via portion 128 of a contact opening in the logic region 104. The via 128 stops on the etch stop layer 110. After the via 128 is formed in the logic region 104, the patterned etch mask may be removed.

FIG. 12 depicts the product 100 after another patterned etch mask (not shown) was formed above the product 100. This patterned etch mask exposes portions of both the memory region 102 and the logic region 104. Thereafter, at least one etching process was performed to form trenches 130 (i.e., contact openings) in the memory region 102 and to form a trench portion 133 of the contact opening in the logic region 104. In one illustrative process flow, after formation of the trench 133, a separate "punch-through" etching process may need to be performed to remove portions of the etch stop layer 110 positioned above the conductive line 108 in the logic region 104. Thereafter, the patterned etch mask may be removed. Note that the sidewall spacer 126A is made of a material that also exhibits good etch selectivity relative to the fifth layer of insulating material 112 as the sidewall spacers 126A remain intact during the process of etching the trenches 130. As depicted, the formation of the trenches 130 exposes the upper surface of the top electrodes 120A. Note that, due to the presence of the internal sidewall spacer 126A, the formation of the lower portion of the trenches 130 is essentially a self-aligned process. That is, in the illustrative example depicted in the enlarged section in the dashed line oval region shown in FIG. 12, a portion of the trench 130 stops on the upper surface 126X of the internal spacer 126A. In one illustrative embodiment, this etching process removes substantially all of the insulating material positioned within the interior of the internal sidewall spacer 126A. In the example depicted in the enlarged section, the trench 130 is substantially perfectly aligned with the internal spacer 126A. Of course, in a real-world device, the trench 130 may be laterally offset from the idealized position depicted in FIG. 12. Additionally, the lateral width of the sidewall spacer 126A may be increased so as to provide a larger process window with respect to the alignment of the trench 130 relative to the top electrode 120A. Since the sidewall spacer 126A will also be exposed to the above-mentioned punch-through etching process, the sidewall spacer 126A will need to exhibit good etch selectivity relative to the material of the etch stop layer 110.

FIG. 13 depicts the product 100 after various process operations were performed to form conductive contact structures 134 and a conductive contact structure 136 in the contact openings. Each of the conductive contact structures 134 is conductively coupled to the top electrode 120A of one of the memory cells 122. The conductive contact structure 136 is conductively coupled to the metal line 108 in the logic region 104. Given that, in some embodiments, a portion of the trench 130 stops on the upper surface 126X of the internal spacer 126A, it follows that a portion of the conductive contact structure 134 will also engage at least a portion of the upper surface 126X of the internal sidewall spacer 126A. FIG. 13 also contains a cross-sectional view taken at the location of the dashed line in the figure. As depicted, the internal spacer 126A surrounds the portion of the conductive contact structure 134 that is positioned within the spacer 126A. In one illustrative example, the portion of the conductive contact structure 134 positioned within the internal spacer 126A contacts and engages the entire internal perimeter of the internal sidewall spacer 126A. The conductive contact structures 134, 136 may be formed using a variety of techniques. In one example, various conformal liners and/or barrier layers may be formed in the trench/via openings. Thereafter, a conductive material, such as tungsten, may be deposited so as to overfill the remaining portions of the trench/via openings. At that point, a CMP process operation may be performed to remove all conductive material positioned above the upper surface of the fifth layer of insulating material 112.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A method of forming a conductive contact structure to a top electrode of a memory device, the method comprising:
    forming a first layer of insulating material adjacent and in physical contact with a side surface of the top electrode of the memory device;
    forming a second layer of insulating material above the first layer of insulating material;
    forming an opening in the second layer of insulating material, the opening exposing an upper surface of the top electrode;
    forming an internal sidewall spacer within the opening in the second layer of insulating material;
    forming a third layer of insulating material above the second layer of insulating material; and
    forming a conductive contact structure that is conductively coupled to the upper surface of the top electrode, wherein the conductive contact structure includes a first portion that is surrounded by the internal sidewall spacer, and a second portion that is surrounded by and in physical contact with at least a portion of the third layer of insulating material,
    wherein the first portion of the conductive contact structure surrounded by the internal sidewall spacer is in physical contact with an entire internal perimeter of the internal sidewall spacer such that the entire internal perimeter of the internal sidewall spacer encloses the first portion of the conductive contact structure.

2. The method of claim 1, wherein forming the internal sidewall spacer comprises:
    forming a conformal layer of a spacer material above the second layer of insulating material and in the opening; and
    forming the internal sidewall spacer within the opening from a portion of the conformed layer of the spacer material.

3. The method of claim 1, wherein, prior to forming the conductive contact structure, the method comprises:
    forming additional insulation material above the second layer of insulating material, the additional insulation material filling a remaining portion of the opening in the second layer of insulating material that is not occupied by the internal sidewall spacer; and
    forming at least a portion of a contact opening in the additional insulating material to expose at least a portion of the upper surface of the top electrode.

4. The method of claim 3, wherein the portion of the contact opening within the internal sidewall spacer is formed in a self-aligned manner.

5. The method of claim 3, wherein at least a portion of the contact opening abuts an upper surface of the internal sidewall spacer.

6. An integrated circuit product, comprising:
a memory cell comprising a top electrode;
a first layer of insulating material adjacent and in physical contact with a side surface of the top electrode,
a second layer of insulating material above the first layer of insulating material;
an opening in the second layer of insulating material, the opening exposing at least a portion of an upper surface of the top electrode;
an internal sidewall spacer positioned within the opening in the second layer of insulating material;
a third layer of insulating material above the second layer of insulating material; and
a conductive contact structure that is conductively coupled to the upper surface of the top electrode, wherein the conductive contact structure includes a first portion that is surrounded by the internal sidewall spacer, and a second portion that is surrounded by and in physical contact with at least a portion of the third layer of insulating material,
wherein the first portion of the conductive contact structure surrounded by the internal sidewall spacer is in physical contact with an entire internal perimeter of the internal sidewall spacer such that the entire internal perimeter of the internal sidewall spacer encloses the first portion of the conductive contact structure.

7. The integrated circuit of claim 6, wherein at least a portion of the conductive contact structure abuts an upper surface of the internal sidewall spacer.

8. The integrated circuit of claim 6, wherein an upper surface of the internal sidewall spacer abuts both at least a portion of the third layer of insulating material and at least a portion of the conductive contact structure.

9. The integrated circuit of claim 6, wherein one or more of the first, the second, and the third layers of insulating material includes a first material, and wherein the internal sidewall spacer includes a second material that is different from the first material.

10. The integrated circuit of claim 6, wherein one or more of the first, the second, and the third layers of insulating material includes silicon dioxide, the internal sidewall spacer includes silicon nitride and the memory cell includes an MTJ (magnetic tunnel junction) memory device, an RRAM (resistive random access memory) device, a PRAM (phase-change random access memory) device, an MRAM (magnetic random access memory) device, or a FRAM (ferroelectric random access memory) device.

11. The integrated circuit of claim 6, wherein the internal sidewall spacer further includes an upper surface that abuts both a portion of the third layer of insulating material and a portion of the conductive contact structure.

12. The method of claim 1, wherein one or more of the first, second, and the third layers of insulating material comprises silicon dioxide, the internal sidewall spacer comprises silicon nitride and the memory device comprises one of an MTJ (magnetic tunnel junction) memory device, an RRAM (resistive random access memory) device, a PRAM (phase-change random access memory) device, an MRAM (magnetic random access memory) device, or a FRAM (ferroelectric random access memory) device.

13. The method of claim 1, wherein an upper surface of the internal sidewall spacer further includes an upper surface that abuts both a portion of the third layer of insulating material and a portion of the conductive contact structure.

* * * * *